United States Patent
Maruyama et al.

Patent Number: 5,580,658
Date of Patent: Dec. 3, 1996

[54] COPPER-CARBON COMPOSITE MATERIAL WITH GRADED FUNCTION AND METHOD FOR MANUFACTURING THE SAME

[75] Inventors: Tadashi Maruyama, Funabashi; Katuhide Nagaoka, Marugame; Masaki Okada, Mitoyo-gun, all of Japan

[73] Assignees: Doryokuro Kakunenryo Kaihatsu Jigyodan, Tokyo, Japan; Toyo Tanso Co., Ltd., Osaka, Japan

[21] Appl. No.: 273,769

[22] Filed: Jul. 12, 1994

[30] Foreign Application Priority Data

Jul. 14, 1993 [JP] Japan ................................. 5-196916

[51] Int. Cl.⁶ .................................................. B32B 9/00
[52] U.S. Cl. ...................... 428/408; 428/307.3; 428/212; 376/287; 423/447.1; 423/447.5
[58] Field of Search ................................. 428/408, 688, 428/689, 698, 704, 304.4, 306.6, 307.3, 307.7, 312.2, 312.8, 218, 244, 367, 368; 164/97, 91; 419/27; 427/226, 227, 228, 237, 249; 264/291, 292, 294; 376/287, 288; 423/447.1, 447.5, 448; 250/515.1

[56] References Cited

U.S. PATENT DOCUMENTS

| | | | |
|---|---|---|---|
| 3,956,568 | 5/1976 | Kanemaru | 428/408 |
| 3,969,754 | 7/1976 | Kuniya et al. | 357/65 |
| 4,442,165 | 4/1984 | Gebhardt | 428/307.7 |
| 4,915,809 | 4/1990 | Brown | 204/243 R |
| 5,080,963 | 1/1992 | Tatarchuk | 428/225 |

FOREIGN PATENT DOCUMENTS

| | | |
|---|---|---|
| 0515186 | 11/1992 | European Pat. Off. . |
| 2411584 | 9/1974 | Germany . |

OTHER PUBLICATIONS

Abstract–JP62207832 "Copper–Carbon Composite Material For Semiconductor And Its Production"; Sep. 12, 1987.
Abstract–JP3295879 "Method For Impregnating Metal Into Carbon Material"; Dec. 26, 1991.
Abstract–JP5186276 "Heat–Receiving Plate Material Produced By Using Carbon Fiber–Reinforced Carbon Composite Material And Its Production"; Jul. 27, 1993.

*Primary Examiner*—Ellis Robinson
*Assistant Examiner*—Leonidas J. Jones, III
*Attorney, Agent, or Firm*—Dickstein, Shapiro & Morin, L.L.P.

[57] ABSTRACT

A function ally gradient composite material containing copper and carbon as main components and having a predetermined shape, in which the composition ratio of the copper to the carbon in the material continuously varies in at least one predetermined direction. The material is manufactured, for example, by impregnating carbon felt with a resin and thermo-compressively molding the impregnated felt (step S101), carbonizing the resin by baking (step S102) to provide a preformed carbon material (step S104). Pyrolytic carbon is thereafter deposited in the preformed carbon material by the CVI method (step S105) to provide a carbon material having the bulk density varying in a predetermined direction (step S107). After the wettability of the carbon material against copper is improved by siliconization (step S108), pores of the carbon material are impregnated with copper (step S109) to obtain a functionally gradient composite material of copper and carbon.

8 Claims, 3 Drawing Sheets

COPPER-CARBON COMPOSITE MATERIAL WITH GRADED FUNCTION AND METHOD FOR MANUFACTURING THE SAME

BACKGROUND OF THE INVENTION

1. Field of the Invention

The present invention relates to a composite material with graded function (hereinafter referred to as functionally gradient composite material) which consists principally of copper and carbon, and more particularly to a copper-carbon functionally gradient composite material suitable for use in a nuclear fusion reactor as materials for wall members or members of high heat flux portions which should be durable against irradiation of high energy electron beam, ion beam or high-speed neutrons, and a method for manufacturing the same.

2. Description of the Prior Art

Heretofore, as a wall member, particularly as a first wall member facing plasma in a nuclear fusion reactor, metal materials such as stainless steel or TiC-coated Mo have been used. These metals, however, tend to evaporate when heated by collision of plasma and to enter the plasma as impurities so that the radiation loss of plasma increases and the temperature of plasma falls.

To eliminate this disadvantage, carbon having the small atomic number, especially graphite have been used in order to reduce the radiation loss of plasma due to impurities. As the reactor wall material facing plasma, isotropic graphite material of high purity and having fine grain structure has been at the focus of attention, but cracks may often be caused in it due to thermal shock when subjected to excessive heat load. Accordingly, there has recently come into the limelight a carbon fiber-reinforced carbon (C/C) composite material having high strength, high thermal conductivity and desirable thermal shock resistance properties.

Such type of carbon material, however, lacks a heat-removing function and it starts evaporating or subliming when subjected to high-temperature heat load. Accordingly, it is necessary to let the carbon material be accompanied by a certain kind of cooling means. This is achieved in general by bringing the carbon material into contact with metal. For instance, brazing is used for uniting copper having high heat conductivity with graphite. This method, however, would require several kinds of metallic buffer materials and brazing filler metals because of the difference in the coefficient of thermal expansion between copper and graphite, and it also requires quite complicated procedures to provide an integral reactor wall member. Furthermore, due to the large difference in the coefficient of thermal expansion as mentioned above, this method is impractical for the integration into large-sized products and requires connection of segmented parts, which undesirably increases the number of parts, necessary labor and time.

Meanwhile, in order to make the carbon material have graded function, there have been used a chemical vapor deposition (hereinafter referred to as CVD) method, a matrix powder mix laminating method, or the laminating method described in Japanese Patent Laid-Open No. Hei 4-295055, and each has its own characteristics.

Among the aforementioned methods, the CVD method is performed by introducing one or more gases and depositing pyrolytic carbon or ceramic on a carbon substrate. In this case, the composition and characteristics of the produced material can be freely adjusted by varying the concentration of each gas. However, it requires a lot of time for the depositing procedure and accordingly it is industrially impractical.

In the powder mix laminating method, several layers of powder are laminated with a calculated particle size-volume ratio of two or more materials and are then shaped by hot press or the like, thereby enabling the production of relatively large-sized products. As a functionally gradient material, however, there are interfaces in proportion to the number of layers. In consequence, the function is not continuously gradient.

Further, in the laminating method described in Japanese Patent Laid-Open No. Hei 4-295055, a number of sheets are laminated and are then pressed, resulting in the stepwise change of composition as mentioned above, so that a uniform change of function does not continue. In order to make such gradient of function close to continuous one, considerable time and labor would be required. As a result, it would be quite impractical in industry.

The present inventors have recognized the necessity of developing materials having gradient composition of C/C composite material and copper as described in "Journal of Plasma and Fusion Research Vol. 69, No. 5(1993) at pp. 439 "Graphite (Carbon) material for Nuclear Fusion Reactor" written by Tetsuro Tanabe and Tadashi Maruyama, but it has not been possible to reach practical stage for realization.

SUMMARY OF THE INVENTION

It is therefore an object of this invention to provide a novel functionally gradient composite material consisting principally of copper and carbon and capable of overcoming the aforementioned technical disadvantages.

It is another object of this invention to provide a method for manufacturing such functionally gradient composite material.

According to a first aspect of this invention, there is provided a functionally gradient composite material containing copper and carbon as main components and having a predetermined shape, wherein the compositional ratio of the copper to the carbon in said material varies in at least one predetermined direction and wherein said variation of the compositional ratio is continuous.

According to a second aspect of this invention, there is provided a functionally gradient composite material as defined in the first aspect of this invention, wherein the compositional ratio of the copper to the carbon successively increases or decreases in at least one predetermined direction.

According to a third aspect of this invention, there is provided a functionally gradient composite material as defined in the first or the second aspect, wherein the compositional ratio of the copper to the carbon varies in the thickness direction of a composite material having a plate-like shape.

According to a fourth aspect of this invention, there is provided a functionally gradient composite material as defined in the first, second or third aspect, wherein said composite material is formed by impregnating pores of a carbon material of which bulk density varies in said predetermined direction with copper.

According to a fifth aspect of this invention, there is provided a functionally gradient composite material as defined in the fourth aspect, wherein the carbon material is graphite.

According to a sixth aspect of this invention, there is provided a functionally gradient composite material as defined in the fourth or fifth aspect, wherein the carbon material is formed by depositing pyrolytic carbon in a carbon fiber-reinforced carbon composite material.

According to a seventh aspect of this invention, there is provided a functionally gradient composite material as defined in the sixth aspect, wherein the carbon fiber-reinforced carbon composite material is formed by impregnating carbon fiber felt with a resin and carbonizing the resin.

According to an eighth aspect of this invention, there is provided a functionally gradient composite material as defined in the sixth or seventh aspect, wherein the bulk density of said carbon fiber-reinforced carbon composite material as a whole is in the range of from 0.1–0.8 $Mg/m^3$, and the bulk density varies in said carbon material while having the upper and lower limits which are in the range of from 0.1 $Mg/m^3$ to 2.2 $Mg/m^3$.

According to a ninth aspect of this invention, there is provided a functionally gradient composite material as defined in the first aspect, wherein the periphery of the pores in the carbon material is siliconized.

According to this invention, a functionally gradient composite material containing copper and carbon as main components and in which the compositional ratio of the copper to the carbon continuously varies in at least one predetermined direction in the composite material may be manufactured, for example, through a process (i)comprising steps of: depositing pyrolytic carbon in pores of a preformed carbon material by the chemical vapor infiltration method in such a manner that the density varies in the predetermined direction in the preformed carbon material; and (ii)impregnating the thus obtained carbon material having the density varying in at least one direction, with copper.

Said process may further comprise a step of siliconizing the periphery of the pores in the carbon material before the impregnation of copper.

In this invention, said variation of the compositional ratio of the copper to the carbon can be freely selected in view of the direction and the state of the variation. Only essential point is that the variation of the compositional ratio of the copper to the carbon, in other words, the compositional ratio of the carbon to the copper is continuous in at least one predetermined direction without discontinuity by the existence of interface or stepwise variations.

The most practical material in general is one in which the compositional ratio successively increases or decreases in at least one direction and such increase or decrease does not occur twice or more. More general form is a composite material of plate-like form (including those having large thickness and regarded as parallelepiped) in which the compositional ratio of copper to carbon varies in the thickness direction. In the composite material of this invention, it is possible to make the material have such a graded function that one end portion of the material does not contain copper while the other end portion is free of carbon. For example, such a compositional change may be realized in which no copper is found on the upper face of the plate body or no copper exists throughout a certain thickness at the upper face side, while no carbon is found at the lower face.

The most advantageous method for providing the composite material of this invention is to make the bulk density of a carbon material vary in at least one predetermined direction, and to impregnate pores formed in the carbon material with copper. By this method, the composite material can be readily manufactured and even large-sized products may be obtained.

The present invention will hereinafter be described more specifically with reference to the composite material obtained by the aforementioned method, however it is to be understood that the embodiments of the present invention are not limited thereto and include an embodiment in which the bulk density of porous copper material is varied and the pores therein are impregnated with a carbonized resin.

DESCRIPTION OF THE PREFERRED EMBODIMENTS

Embodiments of this invention will be described in detail hereinafter with reference to the accompanying drawings.

The carbon materials employable in this invention include carbonized products which have experienced so-called baking carbonizing step and graphitized products which have experienced so-called graphitizing step in addition to the baking-carbonizing step. Those suitable for the aforementioned wall members of a nuclear fusion reactor are the graphitized products, particularly high-purity graphite materials containing lower amounts of ash and impurities.

Figure 1:
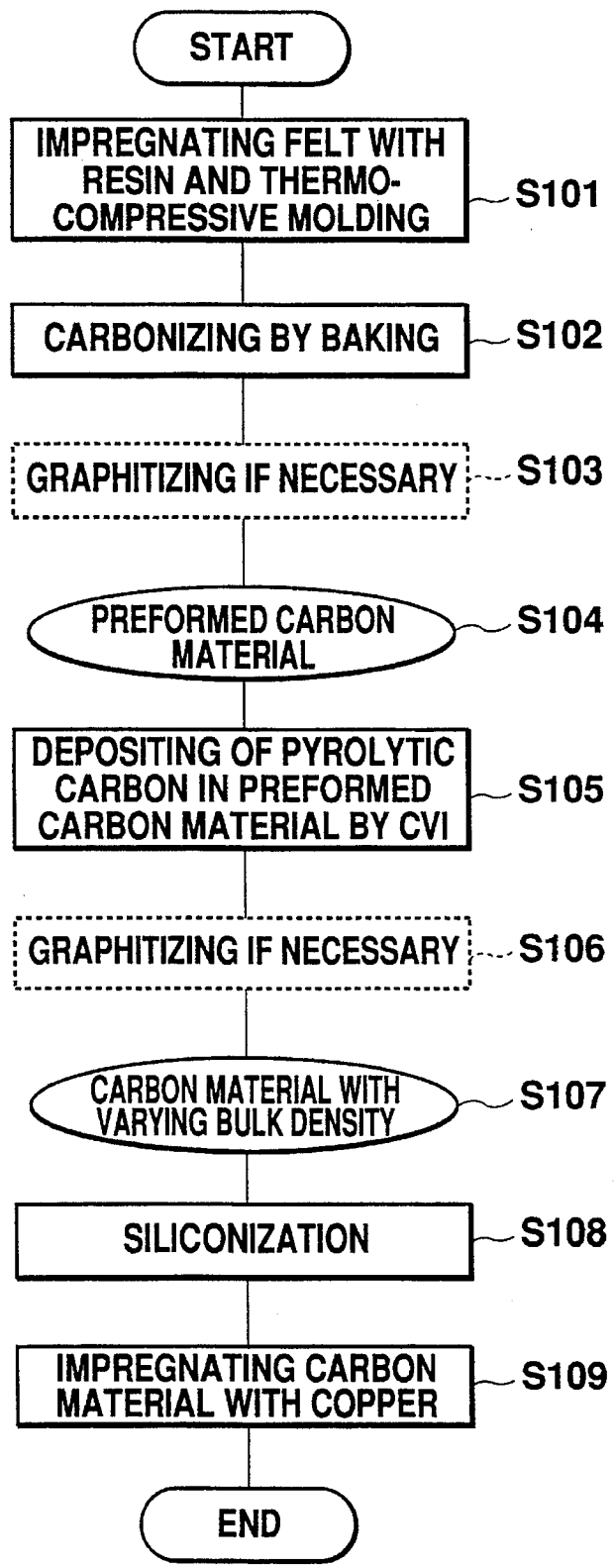
FIG. 1 is a flow diagram showing a method for manufacturing a functionally gradient composite material containing copper and carbon as main components according to one embodiment of this invention.
Figure 2:
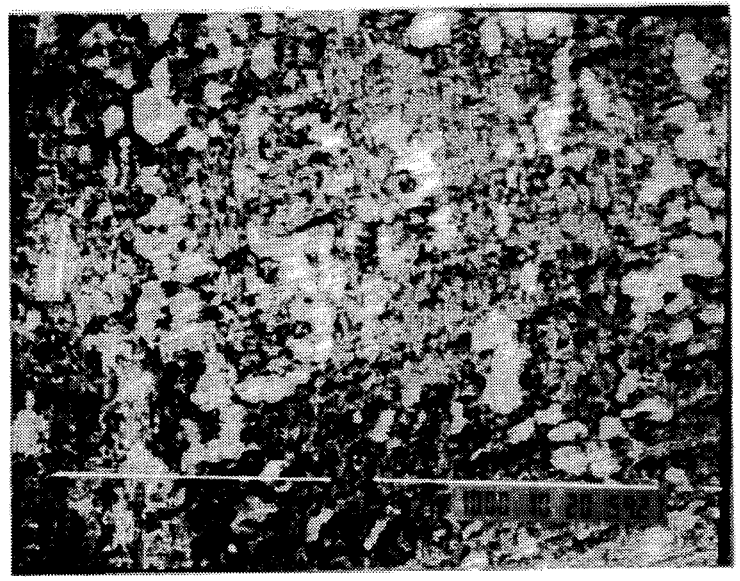
FIG. 2 is a microscopic photograph showing an example of cross sectional view of the texture of the composite material according to this invention.
Figure 3:
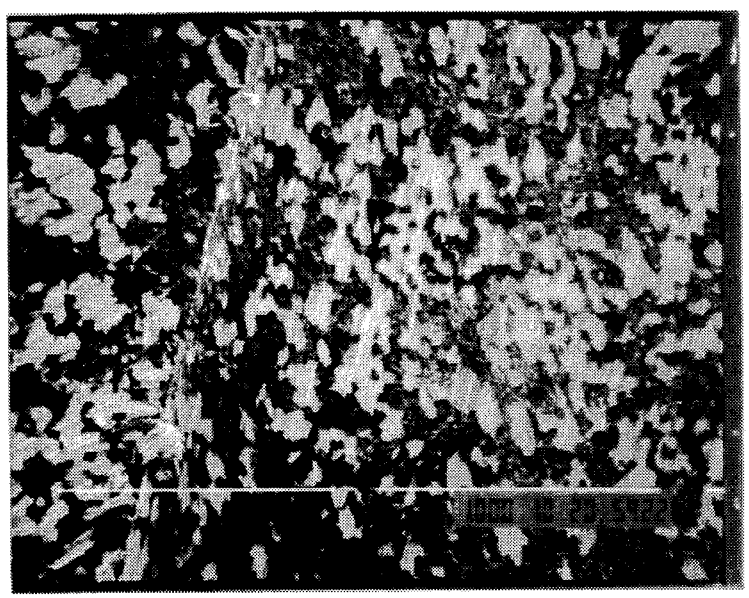
FIG. 3 is a microscopic photograph showing another example cross sectional view of the texture of the composite material according to this invention.
Figure 4:
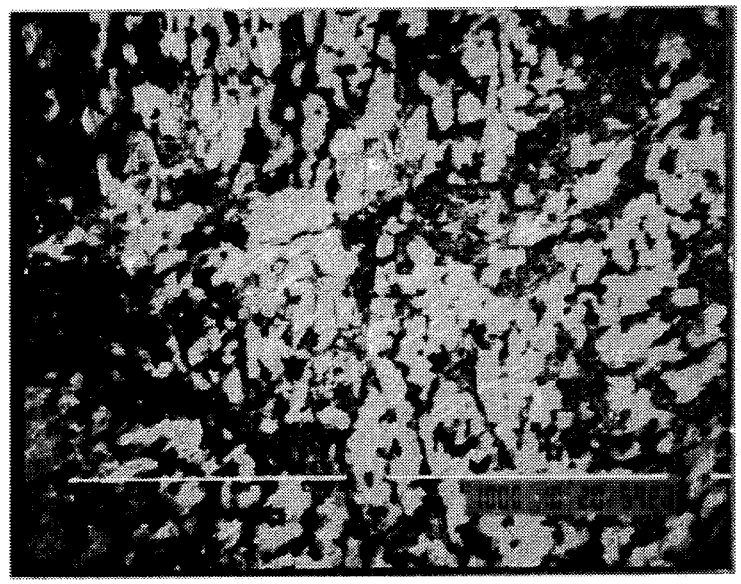
FIG. 4 is a microscopic photograph showing still another example cross sectional view of the texture of the composite material according to this invention.
Figure 5:
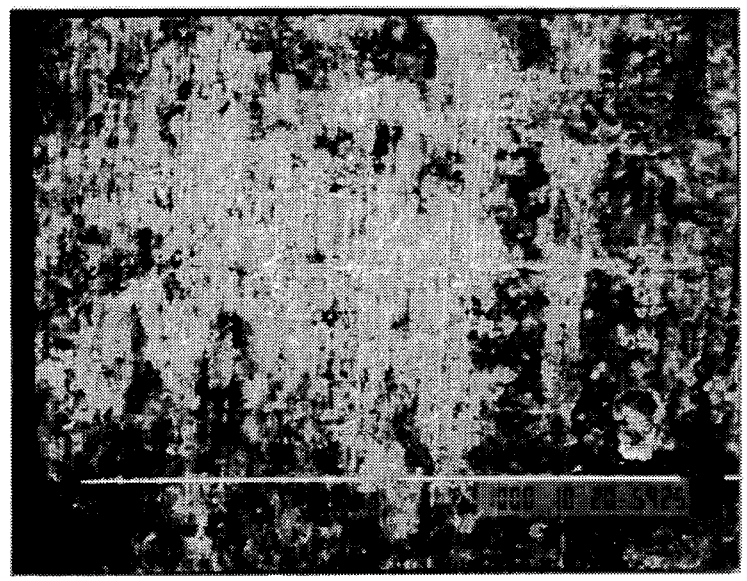
FIG. 5 is a microscopic photograph showing further example cross sectional view of the texture of the composite material according to this invention.

A functionally gradient composite material of copper and carbon according to this invention can be manufactured, for example, in the following manner which will be described with reference to FIG. 1.

Firstly, a method will be described for varying a bulk density in the carbon material.

To begin with, a felt with an adjusted orientation of carbon fibers is impregnated with a resin and is thereafter thermocompressively shaped (step S101 in FIG. 1), baked to carbonize the resin (step S102), and further graphitized if necessary (step S103) to provide a carbon fiber-reinforced carbon composite material, namely, preformed carbon material (S104). The optional graphitizing in step S103 is for the purpose of applying the same heat treatment as in the final thermal history to the material obtained in step S102.

Secondly, pyrolytic carbon is deposited in the preformed carbon material, for example, by chemical vapor infiltration (hereinafter referred to as CVI) (S105), which is then graphitized if necessary (S106). This provides carbon material with the bulk density varying in a predetermined direction (S107). The graphitization in S106 is for promoting the crystallization and thus providing high thermal conductivity. It is also possible to previously combine the carbon material with tungsten carbide WC, titanium carbide Tic or the like to form a composite material before the CVI treatment. The combining step in this case can be performed, for example, by coating or impregnation.

Any type of carbon fiber felt, such as of the PAN (polyacrylnitrile), pitch, rayon, etc. can be used as the above mentioned felt. As the resin used for the aforementioned impregnation, any one that can be carbonized by baking, e.g. phenol resin, furan resin etc. may be employed. From an economical point of view, phenol resin is desirable because of its low cost. The baking process is carried out in an inert gas atmosphere such as nitrogen or argon.

The bulk density of the carbon material before the CVI process (i.e. preformed carbon material) is preferably in the range of from 0.05 to 1.10 $Mg/m^3$ more preferably in the range of from 0.1–0.8 $Mg/m^3$, while the porosity of open pore preferably ranges from 50 to 95%. The bulk density of the preformed carbon material is generally uniform, however it may be nonuniform if desired. In this carbon material, pyrolytic carbon is then deposited by the CVI method using, for example, induction heating furnace or resistance heating furnace. This CVI process is for obtaining high density by depositing pyrolytic carbon in the preformed carbon material upon thermally decomposing carbon-containing gases such as methane, ethane or propane. The temperature of the thermal decomposition is around 1073–2473 K (absolute temperature), and preferably 1873–2273 K. The pressure is 0.1–760 Torr, and preferably 1–10 Torr.

For making the density gradient during the CVI process, such methods may be employed as causing carbon-containing gas to flow in a predetermined direction in an isothermal preformed carbon material, or blowing carbon-containing gas from an arbitrary direction while making the pre-formed carbon material have a temperature gradient (e.g. 1873 K–2073 K) in a predetermined direction.

In this manner, it is possible to obtain the bulk density varying in at least one direction in the carbon material. The bulk density in this case may be varied with upper and lower limits within the range of from 0.1 to 2.2 $Mg/m^3$ between both ends of the carbon material in a certain direction. More specifically, the bulk density may be continuously varied, for example, in the range of from 0.9 $Mg/m^3$ to 1.9 $Mg/m^3$. Normally, the bulk density is successively increased or decreased from one end of the material to another. In this case, by adjusting the kind, flow rate, temperature, pressure or the like of the gas to be used, the varying area (i.e. the extent in which the density is graded, e.g. the extent of varying density in the thickness direction) can be adjusted. The porosity of open pore of the carbon material obtained by the CVI process (total average open pore rate of the material) is preferably selected within the range of from 10 to 80%, and most preferably about 50%.

Next, a method for impregnating carbon material of varying bulk density with copper will now be described.

Siliconization is carried out in advance of the impregnation of copper (S108), for the following reason:

In general, concerning impregnation of a carbon material with metal or glass, the problem lies in the shape and wettability of the pores. The carbon material, due to the variation of the amount of the deposited pyrolytic carbon in a predetermined direction, has a density gradient in that direction. The pore radius ranges from small to large, for example in the range of 10–1000 μm. If the wettability of the metal to be impregnated in the carbon material is excellent, pores of any shape can be impregnated with metal. However, copper does not have good wettability against carbon material. In particular, copper is often difficult to be impregnated in small pores. In this case, there can be used the siliconization of the carbon material, especially the periphery of pores, for improving the wettability of copper with the carbon material.

As a method for siliconization, the following methods may be used in particular the method (1) is advantageous because of its adjustability of physical characteristics and simplicity:

(1) Reaction with SiO at a high temperature;

(2) Reaction with melted silicon; and (3) Coating with aqueous solution containing silicon followed by heat treatment.

The method (1) is called the chemical vapor reaction (CVR) treatment of which conditions include the reaction with SiO gas at 1900–2500 K, preferably 2000–2300 K in an inert gas atmosphere. As a result, the carbon material may be siliconized from its surface to the interior, and from small pores to large ones. The amount of siliconization should be determined taking the porosity of open pore and the area of the walls of pores in the carbon material into consideration. Sufficiently desirable effects can be obtained if the amount is not less than 1%. On the other hand, a significantly siliconized state such as 10–60% can also be available. The amount of siliconization, in this case, represents the percentage of carbon converted by the reaction with silicon.

Thus, the carbon material having wettability against copper improved by siliconization is then impregnated with copper (S109). This impregnation of the copper can be performed by the high-temperature, high-pressure method. This high-temperature, high-pressure method comprises steps of containing carbon material optionally siliconized and copper in a pressure vessel, heating to a temperature at which the copper melts after out-gassing under vacuum, dipping the carbon material in the copper melt and impregnating the carbon material with copper by application of high pressure.

As a condition of this method, any temperature at which the copper can melt is available, for example, 1473 K, a little higher than the melting point can be used. The higher pressure is better, however the pressure of about 100–200 $kg/cm^2$ is sufficient for impregnation. The time of impregnation is desirably 1–3 hours. In this invention, if the performance is the same for a certain use, copper alloy is usable instead of copper. The compositional ratio of the carbon to copper in the thus obtained composite material can be freely adjusted.

An example of a method for manufacturing the composite material according to this invention will now be described in detail with specific conditions and numerical values.

In this example, a high-purity felt manufactured by Toyo Tanso Co., Ltd. (fiber diameter 7 μm, thickness 10 mm, ash content equal to or less than 10 ppm) was used. This felt was impregnated with phenol resin, thermo-compressively shaped into a bulk density of 0.16 $Mg/m^3$, baked to 1273 K in an inert gas atmosphere, and further processed to have high purity by halogen gas to provide a preformed carbon material (bulk density 0.1 $Mg/m^3$, open pore rate 95%).

The preformed carbon material was subsequently contained in a CVI furnace at 2073 K and 1 Torr. Propane gas and hydrogen gas were caused to flow into the furnace at the rate of 1 liter/min and 12 liter/min, respectively, to perform a CVI treatment for 20 hours to deposit pyrolytic carbon. As a result, a felt C/C composite material having a graded density is obtained.

Further, a graphitizing process is applied to the thus obtained functionally gradient felt C/C composite material at 3273 K in an Acheson furnace to provide a graphite-type functionally gradient felt C/C composite material (the porosity of open pore: 50%). The upper face of this graphite-type functionally gradient felt composite material has the bulk density of 1.90 Mg/m$^3$ and the thermal conductivity of 340 W.m.K.

The graphite-type functionally gradient felt composite material thus obtained was then siliconized by CVR process at 2073 K for 8 hours. The amount of siliconization in this case was set to approximately 20%.

The siliconized felt C/C composite material was then impregnated with copper at 1473 K for 1.5 hours by the use of a hot isostatic pressing machine. As a result, not less than 80% of the pores become impregnated with the copper. This impregnation rate is significantly higher than that in the case of not siliconized by CVR (20% of the pore volume), showing a remarkably enhanced siliconizing effect. The volume ratio of C:Cu in this case was 50:50.

The dimension of the graphite-type functionally gradient felt C/C composite material of graphite-copper thus obtained is 50 mm×50 mm×20 mm, considerably larger than the conventional product.

FIGS. 2–5 are microscopic photographs showing cross-sections of the functionally gradient composite material of copper and carbon obtained by the aforementioned method. These pictures correspond to samples having the volume ratio of C/C: Cu of 9:1, 7:3, 4:6, and 1:9 respectively. It can be seen from these photographs that the ratio of the graphite to copper is gradually varied.

In the aforementioned example, the impregnation rate of the copper in the case of not applying siliconization by CVR process was 20% of the pore volume.

As mentioned above, according to this invention, there is provided a totally novel composite material consisting principally of copper and carbon. This composite material can be said to be a novel composite material also from a viewpoint that the compositional ratio of copper to carbon continuously varies. For example, as a plate-type composite material, it is possible to provide those having an upper face made of graphite, an lower face made of copper, with the compositional ratio continuously varying in the thickness direction. Moreover, if the upper face is made of carbon fiber-reinforced carbon composite material having high thermal conductivity, heat can quickly dissipate even when high temperature load is applied, thereby providing an excellent anti-erosion property. In addition, since the lower face is made of copper, cooling members can be readily combined. No delamination arises because of the fact that the graded function is given with the continuous change of compositional ratio. Accordingly, the functionally gradient composite material made of copper and carbon of this invention can sufficiently meet the variety of conditions required for the wall material of, for example, a nuclear fusion reactor.

What is claimed is:

1. A functionally gradient composite material containing copper and carbon as main components and having a predetermined shape, wherein the compositional ratio of the copper to the carbon in said material varies in at least one predetermined direction, wherein said variation of the compositional ratio is continuous, and wherein the carbon material is formed by depositing pyrolytic carbon in a carbon fiber-reinforced carbon composite material.

2. A functionally gradient composite material containing copper and carbon as main components according to claim 1, wherein the compositional ratio of the copper to the carbon successively increases or decreases in at least one predetermined direction.

3. A functionally gradient composite material containing copper and carbon as main components according to claim 1, wherein the compositional ratio of the copper to the carbon varies in the thickness direction of a composite material having a plate shape.

4. A functionally gradient composite material containing copper and carbon as main components according to claim 1, wherein said composite material is formed by impregnating pores of a carbon material of which bulk density varies in at least one predetermined direction with copper.

5. A functionally gradient composite material containing copper and carbon as main components according to claim 4, wherein the carbon material is graphite.

6. A functionally gradient composite material containing copper and carbon as main components according to claim 1, wherein said carbon fiber-reinforced carbon composite material is formed by impregnating carbon fiber felt with a resin and carbonizing the resin.

7. A functionally gradient composite material containing copper and carbon as main components according to claim 1, wherein the bulk density of said carbon fiber-reinforced carbon composite material as a whole is in the range of from 0.1 to 0.8 Mg/m$^3$, and the bulk density varies in said carbon material while having the upper and lower limits which are in the range of from 0.1 Mg/m$^3$ to 2.2 Mg/m$^3$.

8. A functionally gradient composite material containing copper and carbon as main components according to claim 1, wherein the periphery of the pores in the carbon material is siliconized.

\* \* \* \* \*